PULSE FORMING CIRCUIT USING MOMENTARILY CONDUCTING TRANSISTOR BASE-EMITTER LEAKAGE CURRENT TO CHARGE TIMING CAPACITOR

Filed March 8, 1961

INVENTOR.
ROY D. TOTTINGHAM
BY Moody & Anderson
AGENTS

United States Patent Office 3,059,129

Patented Oct. 16, 1962

3,059,129

PULSE FORMING CIRCUIT USING MOMENTARILY CONDUCTING TRANSISTOR BASE-EMITTER LEAKAGE CURRENT TO CHARGE TIMING CAPACITOR

Roy D. Tottingham, Marion, Iowa, assignor to Collins Radio Company, Cedar Rapids, Iowa, a corporation of Iowa Filed Mar. 8, 1961, Ser. No. 94,194

5 Claims. (Cl. 307—88.5)

This invention relates generally to pulse shaping networks and more particularly to a means for developing a short duration, high current pulse from a square wave input.

The present invention has as a primary object the formation of a train of pulses with very short rise and fall time wherein an output pulse is formed for each cycle of a square wave control input voltage. The invention is featured in the provision of a novel transistorized switching arrangement wherein a minimum of circuit components are utilized to effect momentary conduction in one of the transistors in accordance with a controlled charging and discharging arrangement for a capacitor by advantageously using the leakage current between base and emitter of the momentarily conducting transistor during the charging cycle of the capacitor.

It is a general object, therefore, of the present invention to provide a greatly simplified pulse forming network by a unique development utilizing a pair of transistors and a capacitor.

These and other objects and features of the invention will become apparent upon reading the following description in conjunction with the accompanying drawing, in which.

Figure 1:
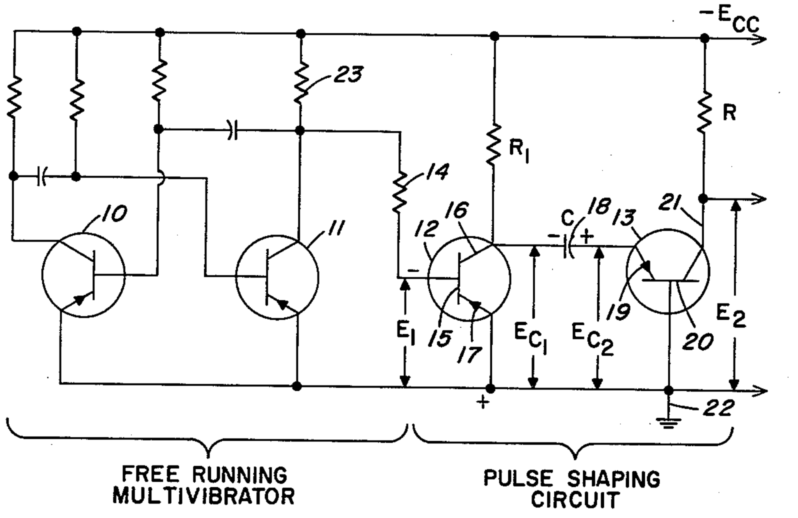
FIGURE 1 is a schematic representation of an embodiment of the invention.

With reference to FIGURE 1, the pulse forming network of the present invention is illustrated as a free-running multivibrator developing a square wave output waveform for application to a pulse shaping circuit. The multivibrator portion of FIGURE 1 forms no part of the present invention. The input waveform $E_1$ to the pulse shaping circuit of FIGURE 1 might be any square wave voltage source, the amplitude of which is sufficient to alternately drive transistor 12 to saturation and cutoff. The square wave output from the free-running multivibrator is taken from the collector of transistor 11 and coupled through resistor 14 to the base 15 of transistor 12. Transistors 12 and 13 coact under the influence of the input square wave $E_1$ to produce the desirable output pulse waveform $E_2$. The collector 16 of transistor 12 is connected through resistor $R_1$ to a negative voltage source $E_{CC}$. The emitter 17 of transistor 12 is connected to ground 22. The base 15 of transistor 12 is connected to the negative voltage source $E_{CC}$ through resistors 14 and 23. A capacitor C is connected between the collector 16 of transistor 12 and the emitter 19 of transistor 13. The base 20 of transistor 13 is connected to ground 22 and the collector 21 of transistor 13 is connected through resistor R to the negative voltage source $E_{CC}$. Considering now the absence of the square wave input $E_1$, transistor 12 in the pulse shaping circuit is forward biased and conductive while transistor 13 is reverse biased and cutoff.

Figure 2:
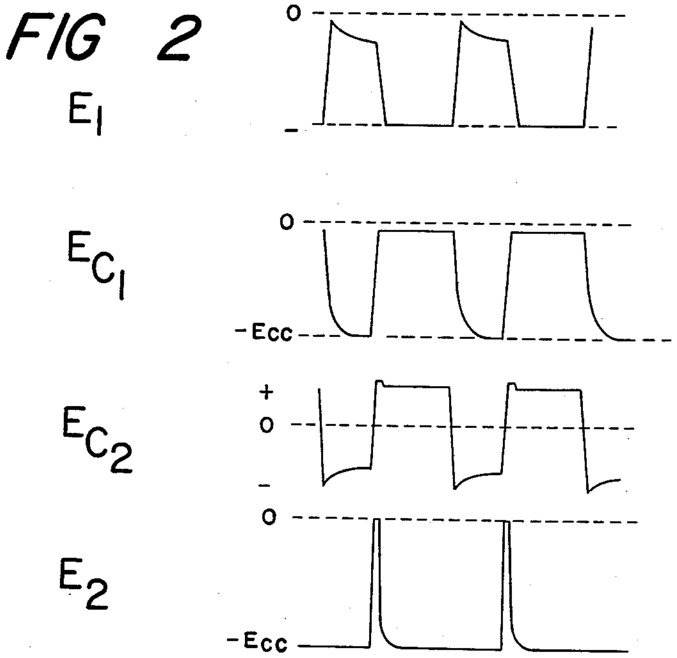
FIGURE 2 illustrates operation waveforms at identified points in FIGURE 1.

With the application of a square wave $E_1$ to the base 15 of transistor 12, the pulse shaping circuit functions to develop an output pulse $E_2$ for each cycle of the square wave. Considering the application of the first half-cycle of input waveform $E_1$ the positive-going waveform is sufficient to drive transistor 12 beyond cutoff and during the last half-cycle the negative-going portion of $E_1$ is sufficient in amplitude to saturate transistor 12. The collector waveform of transistor 12 is illustrated in FIGURE 2 as the waveform $E_{C_1}$. During the first half cycle when transistor 12 is cutoff, capacitor C charges toward $E_{CC}$ through resistor $R_1$ and the high inverse emitter-to-base resistance of transistor 13. The charging of capacitor C produces the rounded leading edge of waveform $E_{C_1}$. During the second half cycle of input waveform $E_1$, transistor 12 is driven into saturation and capacitor C discharges rapidly through the low forward impedance of the collector-to-emitter junction of transistor 12. The charge on capacitor C effects a forward bias of the base-emitter junction of transistor 13 at this instant. The discharge current is a forward bias current for transistor 13 and transistor 13 is forced into rapid conduction and saturation during the short time of the capacitor discharge current pulse to form the output waveform $E_2$.

The short output pulse $E_2$ is seen to be formed at the instant transistor 12 is driven from cutoff to saturation by the input square wave. Output transistor 13 is seen then to be cutoff except during the time period of the discharge of capacitor C.

Transistor 12 functions to effect the alternate charging and discharging of capacitor C as a function of the input square wave voltage. When transistor 12 is cutoff, capacitor C charges through $R_1$ and the emitter-base junction of transistor 13. As capacitor C charges to the supply voltage through this path, the emitter-base junction of transistor 13 is reverse biased, forming a high impedance charge path. The saturation of transistor 12 by the input waveform $E_1$ presents a low impedance between the input side of capacitor C and ground. This places the voltage built up across the capacitor C during its charge across the emitter-base junction of transistor 13 in such a polarity to forward bias this junction. Capacitor C discharges rapidly through this low impedance path of the saturated transistor 12 and emitter-base junction of transistor 13. The emitter-base junction of transistor 13 remains forward biased for just the length of time that it takes capacitor C to discharge through this low impedance path. During this time, transistor 13 conducts through its base-collector circuit, driving the collector of transistor 13 to saturation and forming the output pulse $E_2$.

The transistor 12 is thus seen to function, in response to the square wave input from the multivibrator, as a switch connected from the junction of $R_1$ and C to ground 22. The "switch" alternately "closes" to short this junction to ground 22 and "opens" to present a very high impedance from the junction to ground. When the "switch" is "open" (transistor 12 cutoff), capacitor C charges through $R_1$ and the high inverse impedance of the base-emitter junction of transistor 13 towards the supply $E_{CC}$ with relative polarity as indictaed in FIGURE 1. When the switch "closes" (transistor 12 driven to saturation) the junction between C and $R_1$ is essentially grounded and a low impedance discharge path is closed for capacitor C through the forward-biased emitter-base junction of transistor 13 and the emitter-collector path of transistor 12 to form the rapid pulse of forward biasing current for transistor 13 from which the collector pulse $E_2$ is developed.

An embodiment of FIGURE 1 was constructed with the following parameters:

Resistor 23—2.87K
Resistor 14—31.6K
Resistor $R_1$—1.5K
Resistor R—(Varied)
Capacitor C—(Varied)
Transistor Type 2N247
$E_{CC}$—10.6 volts Multivibrator capacitors 0.33 μf.
Multivibrator base resistors 42.2K
Multivibrator collector resistors 2.87K Test data on the above embodiment substantiated that with variation in C and R values, waveforms $E_1$, $E_{C_1}$, and $E_{C_2}$ remain relatively constant as follows:

Waveform $E_1$: 0.17 volt peak-to-peak, 800 c.p.s. square wave. Rise time: 30 $\mu$sec. peak-to-peak (negative-going). Fall time: 20 $\mu$sec. peak-to-peak (positive going).

Waveform $E_{C_1}$: 10.2 volts peak-to-peak (saturation to cutoff). Rounded on leading edge of negative-going side (cutoff).

Waveform: $E_{C_2}$: 6 volts peak-to-peak distorted square wave.

Waveform: $E_2$: 10.6 volt pulse at 800 per second; width and rise time as shown in the following table with C varied, and resistor $R$=10K ohms.

| C $\mu$f.±5% | $E_2$ rise time $\mu$sec. | $E_2$ fall time $\mu$sec. | $E_2$ pulse width $\mu$sec. |
|---|---|---|---|
| .007 | 5 | 8 | 36 |
| .017 | 5 | 10 | 46 |
| .027 | 5 | 14 | 55 |
| .037 | 5 | 15 | 60 |
| .047 | 5 | 20 | 66 |
| .057 | 5 | 25 | 73 |
| 1.007 | 5 | 150 | 230 |

Variation of output load resistor R above 10K ohms improved the rise time of output pulse $E_2$ for R values up to 20K ohms, above which no significant rise time improvement was evidenced. The fall time grew progressively longer with increases in R.

Variation of R below 10K ohms improved the fall time for values of R down to 4K ohms, beneath which no fall time improvement was evidenced. The rise time grew progressively longer with decreases in R, and for values below 4K ohms, pulse $E_2$ became rounded and reduced in amplitude, indicating that transistor 13 was not being saturated during the pulse duration due to the low collector resistor R.

With a constant value of $C$=0.27 $\mu$f., variations of R from 4K ohms to 20K ohms, while altering the rise and fall times of output $E_2$ as above discussed, resulted in a relatively constant mid-amplitude pulse width of 55 $\mu$sec. as follows:

$R$=20K, $C$=0.027 $\mu$f.
Rise time=3 $\mu$sec.
Fall time=25+$\mu$sec.
$R$=4K, $C$=0.027 $\mu$f.
Rise time=12 $\mu$sec.
Fall time=6 $\mu$sec.

The present invention is thus seen to provide a simple means of generating a sharp, high amplitude, output pulse in response to a square wave input; the pulse occurring at the half-cycle cross-over point of each square wave cycle. In the illustrated embodiment, the pulse is formed at the initiation of the negative-going half cycles of the square wave. It is to be realized that the employment of type NPN transistors rather than the PNP type illustrated would necessitate a positive $E_{CC}$ source and a negative-going pulse $E_2$ would be developed at the initiation of the positive-going half cycles of the square wave input. It is also to be noted that the pulse width and time duration of pulse $E_2$ are independent of the rise and/or fall time of the input controlling square waves and that the square waveform may be considerably distorted and yet effect output pulse formation; it being necessary only that the magnitude of the square wave be sufficient to bias switching transistor 12 alternately into saturation and cutoff states.

Although this invention has been described wtih respect to a particular embodiment thereof, it is not to be so limited, as changes and modifications may be made therein which are within the spirit and scope of the invention as defined by the appended claims.

I claim:

1. Pulse generating means comprising a transistor having an input junction and an output junction and including an electrode common to each of said junctions, a direct-current voltage supply source connected across said output junction and being polarized to effect a reverse bias thereof, a capacitor, switching means serially connected with said capacitor and said transistor input junction, said switching means when closed effectively connecting said capacitor across the input junction of said transistor, said switching means when opened effectively connecting said capacitor serially with said transistor input junction and said direct-current voltage supply source, means for alternately opening and closing said switching means, said capacitor charging toward said direct-current source voltage upon said switching means being open and discharging through said transistor input junction and said switching means upon said switching means being closed, said capacitor upon discharging effecting a forward bias current flow through said transistor input junction, and an output taken across the output junction of said transistor.

2. Pulse generating means comprising a transistor with base, emitter, and collector electrodes, a direct-current voltage supply source, said base electrode connected to a first terminal of said supply voltage, said collector electrode connected through a first resistor to the other terminal of said supply source, said emitter electrode serially connected through a capacitor and a second resistor to said other terminal of said supply source, said supply source terminals being polarized to effect a reverse bias of the junction between said transistor collector and base electrodes, switching means connected serially from the junction of said capacitor and second resistor to said first supply source terminal, control means for alternately opening and closing said switching means whereby said aforedefined capacitor junction is alternately effectively connected to said supply source first and other terminals, respectively, said switching means upon closing effecting a conducting interval of said transistor in accordance with the discharge of said capacitor therethrough.

3. Pulse generating means as defined in claim 2 wherein said switching means comprises a second transistor having input, output, and common electrodes, said output electrode connected to the junction of said capacitor and said second resistor, said common electrode connected to said supply source first terminal; said switch control means comprising, an input control signal applied to said transistor input electrode, said input control signal alternately effecting conductive and nonconductive intervals of said second transistor.

4. Pulse generating means comprising first and second transistors each having input and output junctions, means including a direct-current voltage source connected to said first and second transistors and quiescently biasing said first and second transistors forwardly and beyond cutoff respectively, a control signal source applied to the input junction of said first transistor, said first transistor being alternately cutoff and conductively saturated responsive to said signal source, a capacitor connected between the output of said first transistor and the input junction of said second transistor, said capacitor charging toward said direct-current supply voltage during cutoff of said first transistor through the input junction of said second transistor, said capacitor discharging through the input junction of said second transistor and said first transistor during saturation of said first transistor, said second transistor being rendered conductive in accordance with said capacitor discharge through the input junction thereof, and an output taken across said second transistor output junction.

5. Pulse generating means as defined in claim 4 wherein said control signal source comprises a square wave having a predetermined amplitude and polarity and alternately effecting conduction and cutoff of said first transistor.

No references cited.